(12) United States Patent  
Kim

(10) Patent No.: US 9,140,926 B2  
(45) Date of Patent: Sep. 22, 2015

(54) SEMICONDUCTOR WIRE GRID, DISPLAY APPARATUS HAVING THE SAME, AND METHOD OF MANUFACTURING THE DISPLAY APPARATUS

(75) Inventor: Eok-su Kim, Seongnam-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 146 days.

(21) Appl. No.: 12/805,932

(22) Filed: Aug. 25, 2010

(65) Prior Publication Data

US 2011/0168999 A1 Jul. 14, 2011

(30) Foreign Application Priority Data

Jan. 13, 2010 (KR) .................. 10-2010-0003135

(51) Int. Cl.
| | |
|---|---|
| H01L 29/04 | (2006.01) |
| G02F 1/1335 | (2006.01) |
| G02F 1/1368 | (2006.01) |
| H01L 27/12 | (2006.01) |
| H01L 29/06 | (2006.01) |

(52) U.S. Cl.
CPC ........ *G02F 1/133528* (2013.01); *G02F 1/1368* (2013.01); *G02F 2001/133548* (2013.01); *G02F 2001/133565* (2013.01); *H01L 27/124* (2013.01); *H01L 27/1225* (2013.01); *H01L 29/0665* (2013.01)

(58) Field of Classification Search
CPC ............ H01L 27/1225; H01L 29/0665; G02F 1/133528; G02F 1/1368

USPC ............... 257/59, 786, E23.01, E33.067, 257/E21.158; 438/34

See application file for complete search history.

(56) References Cited

U.S. PATENT DOCUMENTS

| 4,688,897 A | 8/1987 | Grinberg et al. |
|---|---|---|
| 5,986,730 A | 11/1999 | Hansen et al. |
| 7,336,323 B2 | 2/2008 | Wang |
| 7,480,017 B2 | 1/2009 | Fisher et al. |
| 7,573,546 B2 | 8/2009 | Lee et al. |
| 2002/0063835 A1* | 5/2002 | Kim ............................ 349/141 |
| 2003/0142400 A1 | 7/2003 | Hansen et al. |
| 2008/0002079 A1* | 1/2008 | Kimura ......................... 349/42 |
| 2008/0094547 A1* | 4/2008 | Sugita et al. ................... 349/96 |
| 2008/0303987 A1* | 12/2008 | Kumai ........................... 349/96 |

FOREIGN PATENT DOCUMENTS

| JP | 2007-272113 | 10/2007 |
|---|---|---|
| JP | 2008-122761 | 5/2008 |
| KR | 10-0441162 | 7/2004 |
| KR | 2009046398 A | * 5/2009 |

* cited by examiner

*Primary Examiner* — Vongsavanh Sengdara

(74) *Attorney, Agent, or Firm* — Harness, Dickey & Pierce, P.L.C.

(57) ABSTRACT

A semiconductor wire grid may include a plurality of wires arranged separately on a substrate, formed of a semiconductor, and including a groove therebetween, wherein conductivity of the semiconductor wire grid varies according to an applied voltage such that a polarization rate of the semiconductor wire grid is controlled.

16 Claims, 7 Drawing Sheets

SEMICONDUCTOR WIRE GRID, DISPLAY APPARATUS HAVING THE SAME, AND METHOD OF MANUFACTURING THE DISPLAY APPARATUS

CROSS-REFERENCE TO RELATED APPLICATIONS

This application claims priority under U.S.C. §119 to Korean Patent Application No. 10-2010-0003135, filed on Jan. 13, 2010, in the Korean Intellectual Property Office (KIPO), the entire contents of which are incorporated herein by reference.

BACKGROUND

1. Field

Example embodiments relate to methods and apparatuses for a semiconductor wire grid, a display apparatus having the semiconductor wire grid, and a method of manufacturing the display apparatus.

2. Description of the Related Art

In many applied fields, the polarization characteristic of light may be used to control light emitted from a light source. For example, in a liquid crystal display (LCD) device using a liquid crystal panel, liquid crystal molecules of the liquid crystal panel may change the polarization direction of a linearly polarized light, thereby performing a function as a shutter to transmit or block the light. The LCD device may include first and second polarizers having polarization directions perpendicular to each other and a liquid crystal layer provided between the first and second polarizers. A thin film transistor (TFT) may be provided in each pixel.

The on/off of a voltage of each pixel may be controlled according to a switching operation of the TFT. For example, when a voltage of a pixel is on, the arrangement of liquid crystal molecules may be twisted. Accordingly, the polarization direction of incident light may change along the arrangement of liquid crystal molecules and may pass through the liquid crystal layer, thereby passing through the second polarizer. That is, when the liquid crystal molecules are twisted, white may be displayed. When the liquid crystal molecules are not twisted, black may be displayed.

SUMMARY

Provided are wire grids formed of semiconductors, display apparatuses for displaying an image by having a semiconductor wire grid, and methods for manufacturing a display apparatus having a semiconductor wire grid. Additional aspects will be set forth in part in the description which follows and, in part, will be apparent from the description, or may be learned by practice of example embodiments.

According to example embodiments, a semiconductor wire grid may include a plurality of wires arranged separately on a substrate, the plurality of wires formed of a semiconductor and including a groove therebetween, wherein conductivity of the semiconductor wire grid varies according to an applied voltage such that a polarization rate of the semiconductor wire grid is controlled.

The plurality of wires may include at least one selected from a group consisting of carbon (C), silicon (Si), silicon germanium (SiGe), gallium nitride (GaN), gallium arsenide (GaAs), indium antimonide (InSb), indium phosphide (InP), and cadmium sulphide (CdS). The semiconductor of the plurality of wires may include at least one of an oxide semiconductor and an organic semiconductor. The plurality of wires may include at least one of carbon nanotube and graphene.

According to example embodiments, a display apparatus may include a semiconductor wire grid above a backlight unit, the semiconductor wire grid formed of a semiconductor and a polarization panel under or above the semiconductor wire grid, wherein conductivity of the semiconductor wire grid varies according to an applied voltage such that a polarization rate of the semiconductor wire grid is controlled.

The semiconductor wire grid may include at least one selected from a group consisting of carbon (C), silicon (Si), silicon germanium (SiGe), gallium nitride (GaN), gallium arsenide (GaAs), indium antimonide (InSb), indium phosphide (InP), and cadmium sulphide (CdS). The semiconductor of the plurality of wires may include at least one of an oxide semiconductor and an organic semiconductor. The plurality of wires may include at least one of carbon nanotube and graphene.

The display apparatus may further include a pixel electrode above the semiconductor wire grid, wherein the pixel electrode may apply the voltage to the semiconductor wire grid and a thin film transistor (TFT) for switching the pixel electrode. The semiconductor wire grid may be formed of the same material as that of a channel layer of the thin film transistor.

The semiconductor wire grid may be formed of an n-type semiconductor. When a positive voltage is applied to the pixel electrode, the semiconductor wire grid may perform a polarization operation, and as the amount of the positive voltage increases, the polarization rate may increase. When a negative voltage is applied to the pixel electrode, the semiconductor wire grid may not perform the polarization operation.

The semiconductor wire grid may be formed of a p-type semiconductor. When a negative voltage is applied to the pixel electrode, the semiconductor wire grid may perform a polarization operation, and as the absolute value of the negative voltage increases, a polarization rate may increase. When a positive voltage is applied to the pixel electrode, the semiconductor wire grid may not perform the polarization operation.

The semiconductor wire grid may further include a plurality of wires arranged separately on a substrate, the plurality of wires formed of a semiconductor and including a groove therebetween.

According to example embodiments, a method of manufacturing a display apparatus may include forming a gate electrode on a substrate, depositing an insulation layer on the gate electrode and the substrate, patterning a channel layer and a semiconductor wire grid on the insulation layer, the semiconductor wire grid including a plurality of semiconductor wires arranged separately and forming a source electrode and a drain electrode arranged separately on the channel layer.

The semiconductor wire grid may include at least one selected from a group consisting of carbon (C), silicon (Si), silicon germanium (SiGe), gallium nitride (GaN), gallium arsenide (GaAs), indium antimonide (InSb), indium phosphide (InP), and cadmium sulphide (CdS). The semiconductor of the plurality of wires may include at least one of an oxide semiconductor and an organic semiconductor. The plurality of wires may include at least one of carbon nanotube and graphene.

The method may further include patterning a pixel electrode to contact the drain electrode and cover an upper portion of the semiconductor wire grid.

BRIEF DESCRIPTION OF THE DRAWINGS

These and/or other aspects will become apparent and more readily appreciated from the following description of example embodiments, taken in conjunction with the accompanying drawings of which.

DETAILED DESCRIPTION

Figure 1:
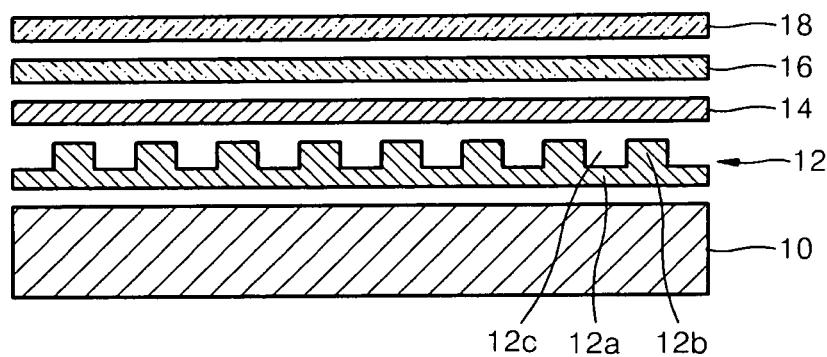
FIG. 1 is a schematic cross-sectional view of a display apparatus according to example embodiments.

Reference will now be made in detail to example embodiments, examples of which are illustrated in the accompanying drawings, wherein like reference numerals refer to the like elements throughout. In the drawings, thicknesses of layers or regions are exaggerated for clarity. In this regard, example embodiments may have different forms and should not be construed as being limited to the descriptions set forth herein. Accordingly, example embodiments are merely described below, by referring to the figures, to explain aspects of the present description.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. As used herein the term "and/or" includes any and all combinations of one or more of the associated listed items.

It will be understood that, although the terms "first", "second", etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises", "comprising", "includes" and/or "including," if used herein, specify the presence of stated features, integers, steps, operations, elements, and/or components, but do not preclude the presence or addition of one or more other features, integers, steps, operations, elements, components, and/or groups thereof.

Example embodiments are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of example embodiments.

Unless otherwise defined, all terms (including technical and scientific terms) used herein have the same meaning as commonly understood by one of ordinary skill in the art to which example embodiments belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein.

FIG. 1 is a schematic cross-sectional view of a display apparatus according to example embodiments. Referring to FIG. 1, the display apparatus according to example embodiments may include a backlight unit 10 for emitting light and a semiconductor wire grid 12 formed of a semiconductor to control the polarization rate of the light emitted from the backlight unit 10.

The backlight unit 10 may include a plurality of light sources. The backlight unit 10 may be classified into a direct light type and an edge light type according to the arrangement of the light source. According to the direct light type, a light source may be installed under the semiconductor wire grid 12 and may emit light directly to the display apparatus. In contrast, according to the edge light type, light may be emitted to the semiconductor wire grid 12 via a light guide plate (not shown). The display apparatus according to example embodiments may be applied to both the direct light type and the edge light type. FIG. 1 illustrates a direct-light type display apparatus. The light source may employ, for example, a light emitting diode (LED), an organic light emitting diode (OLED), or a cold cathode fluorescent light (CCFL).

The semiconductor wire grid 12 may be formed by arranging a plurality of wires 12b on a substrate 12a to be separated a predetermined or given distance from each other. The arrangement cycle of the wires 12b of the wire grid 12 may be shorter than the wavelength of incident light. The substrate 12a may be provided as a body separated from the wires 12b. A groove 12c may be provided between the wires 12b. Each wire 12b may be formed of a semiconductor.

For example, the wire 12b may include semiconductors of Groups III, IV and V, or a compound thereof. The wire 12b may include, for example, at least one selected from a group consisting of carbon (C), silicon (Si), silicon germanium (SiGe), gallium nitride (GaN), gallium arsenide (GaAs), indium antimonide (InSb), indium phosphide (InP), and cadmium sulphide (CdS). The wire 12b may include an oxide semiconductor or an organic semiconductor. The oxide semiconductor may be, for example, any one of zinc oxide, tin oxide, GaInZn oxide, and InZn oxide. The wire 12b may include carbon nano tube or graphene.

The semiconductor wire grid 12 has a conductivity that varies according to the voltage applied thereto. When the conductivity of the semiconductor wire grid 12 varies, the polarization rate of light passing through the semiconductor wire grid 12 may vary as well. The function of a wire grid as a polarizer may be widely known. For example, the wire grid may transmit only light of a first polarization of incident light. Furthermore, in addition to the function as a polarizer, the semiconductor wire grid 12 may function to control the polarization rate by changing the conductivity thereof.

The polarization rate indicates a degree of transmitting the light of a first polarization and blocking light of a second polarization of the incident light. When the conductivity of a wire grid is higher, the transmissivity of the light of a first polarization may be higher, whereas the light of a second polarization may be lower. Accordingly, the function of the semiconductor wire grid 12 as a polarizer may be increased. When the conductivity of a wire grid is low, the light of a first polarization and the light of a second polarization may both be transmitted. Accordingly, the function of the semiconductor wire grid 12 as a polarizer may be reduced.

A polarization panel 18 may be provided above the semiconductor wire grid 12. The polarization panel 18 may, for example, transmit the light of a second polarization and block the other light. The first polarization direction and the second polarization direction may be perpendicular to each other. A pixel electrode 14 to apply a voltage to the semiconductor wire grid 12 may be further provided between the semiconductor wire grid 12 and the polarization panel 18. However, an electrode to apply a voltage to the semiconductor wire grid 12 may not be limited to the pixel electrode 14. A color filter 16 may be further provided above the pixel electrode 14.

Figure 2:
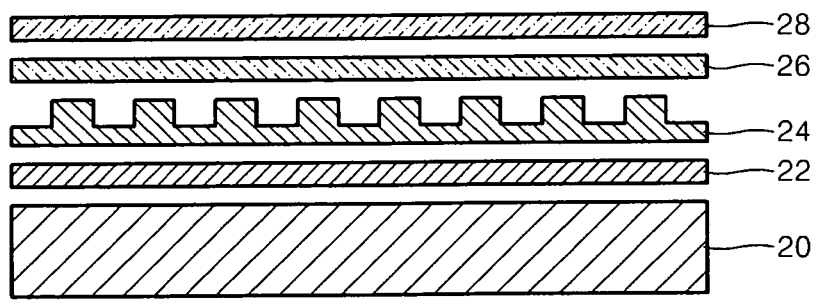
FIG. 2 is a schematic sectional view of a display apparatus according to example embodiments.

FIG. 2 is a schematic sectional view of a display apparatus according to example embodiments. Referring to FIG. 2, the display apparatus according to example embodiments is different from the display apparatus of FIG. 1 in that the position of a polarization panel may be changed. The display apparatus of FIG. 2 may include a backlight unit 20, a polarization panel 22 provided above the backlight unit 20, and a semiconductor wire grid 24 provided above the polarization panel 22. A pixel electrode 26 may be provided above the semiconductor wire grid 24. A color filter 28 may be provided above the pixel electrode 26.

Figure 3A:
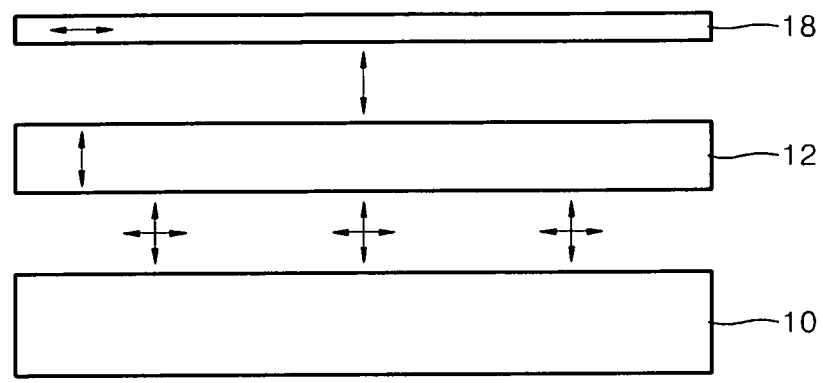
FIGS. 3A-3C explain the operation of the display apparatus of FIG. 1.

The operation of the display apparatus of FIG. 1 will be described below with reference to FIGS. 3A-3C. When a voltage is applied to the semiconductor wire grid 12 such that the semiconductor wire grid 12 operates as a polarizer ($V_0$), a first voltage $V_1$ that is equal to or higher than $V_0$ may be applied to the semiconductor wire grid 12 as illustrated in FIG. 3A. When the first voltage $V_1$ is applied to the semiconductor wire grid 12, the conductivity of the semiconductor wire grid 12 may increases so that the semiconductor wire grid 12 may function as a polarizer. Light which is not polarized may be incident on the backlight unit 10 and the light of a first polarization, for example, P-polarized light, passes through the semiconductor wire grid 12 and may be incident on the polarization panel 18. Because the polarization panel 18 transmits the light of a second polarization, for example, S-polarized light, the light of a first polarization may be blocked by the polarization panel 18. Thus, in the case of FIG. 3A, light may not be transmitted so that black may be displayed.

Figure 3B:
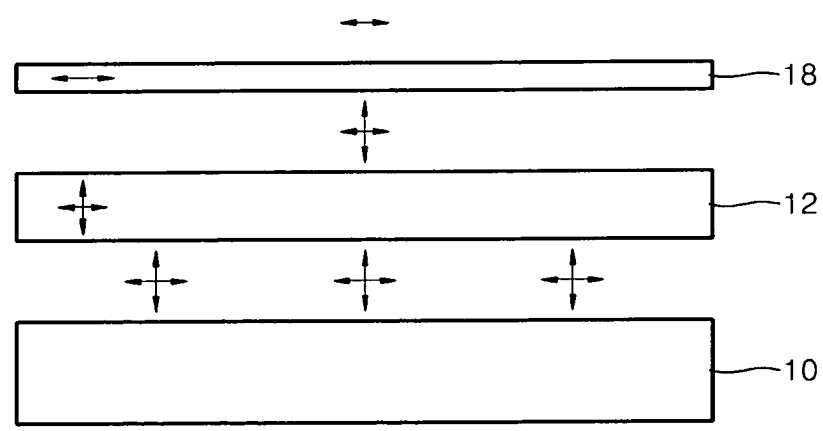

FIG. 3B illustrates a second voltage $V_2$ that is lower than $V_0$ being applied to the semiconductor wire grid 12. In example embodiments, the polarization rate of the semiconductor wire grid 12 may be reduced compared to the case in which the first voltage $V_1$ is applied so that, of the light of no polarization emitted from the backlight unit 10, part of the light of a second polarization with the light of a first polarization passes through the semiconductor wire grid 12. Also, only the part of the light of a second polarization may be transmitted by the polarization panel 18.

Figure 3C:
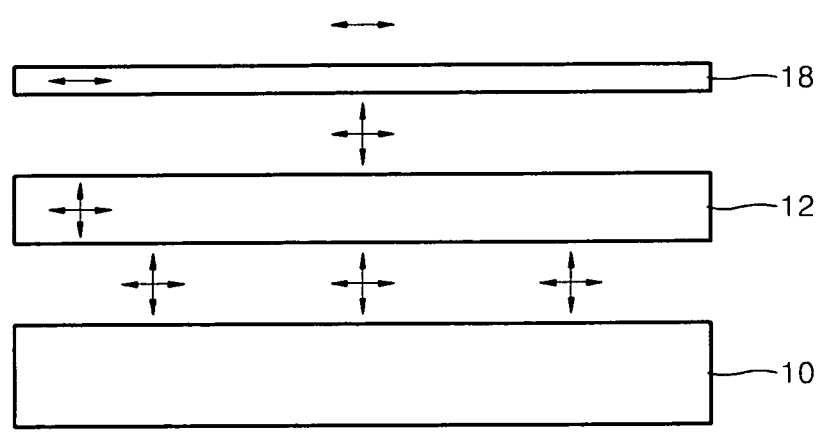

FIG. 3C illustrates a third voltage $V_3$ that is lower than $V_2$ being applied to the semiconductor wire grid 12. As the voltage decreases, the polarization rate of the semiconductor wire grid 12 decreases so that the semiconductor wire grid 12 may not perform a polarization operation. In example embodiments, the light from the backlight unit 10 passes through the semiconductor wire grid 12 without being polarized. Of the light passing through the semiconductor wire grid 12, the light of a second polarization may be transmitted by the polarization panel 18 so that white may be displayed.

As a result, gradation may be displayed by adjusting the amount of voltage applied to the semiconductor wire grid 12 to control the polarization rate of the semiconductor wire grid 12. As a variety of colors are displayed via the color filter 16, a color image may be displayed.

In the display apparatus of FIG. 2, the light of a first polarization of the light from the backlight unit 20 may be transmitted by the polarization panel 22. Accordingly, gradation may be displayed by adjusting the amount of voltage applied to the semiconductor wire grid 24 to control the polarization rate of the light of a first polarization. According to the display apparatus of example embodiments, gradation may be displayed without a liquid crystal layer so that production costs may be reduced.

Figure 4:
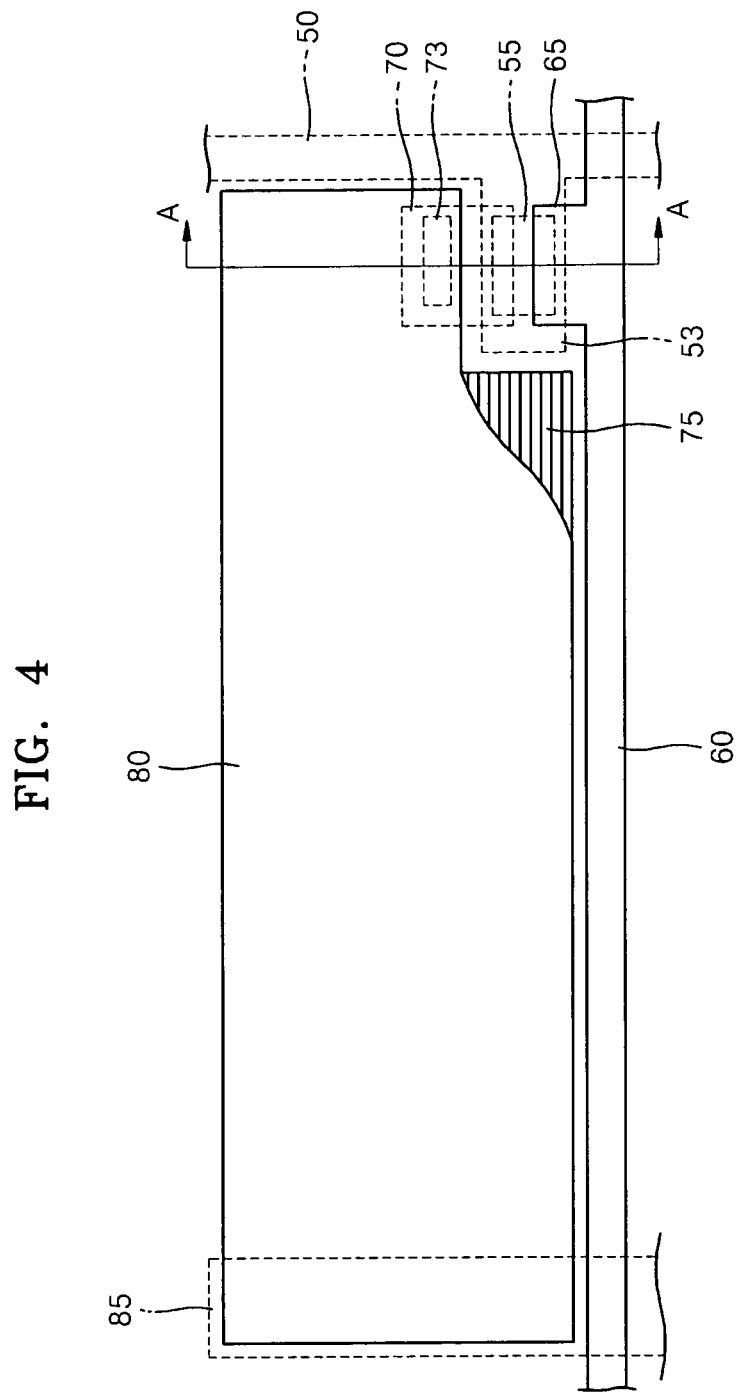
FIG. 4 schematically illustrates the driving device of a display apparatus according to example embodiments.
Figure 5:
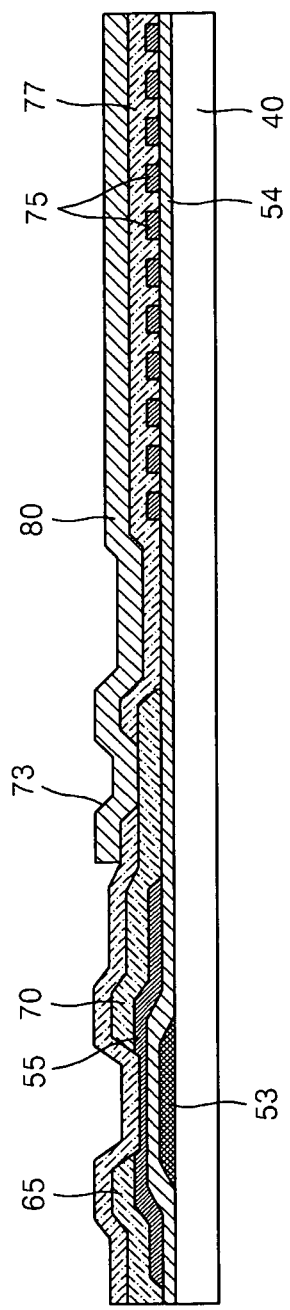
FIG. 5 is a cross-sectional view taken along line A-A of FIG. 4.

FIG. 4 schematically illustrates the driving device of a display apparatus according to example embodiments. FIG. 5 is a cross-sectional view taken along line A-A of FIG. 4. A pixel electrode 80 may be provided on a semiconductor wire grid 75. The pixel electrode 80 may be switched by a thin film transistor (TFT). Referring to FIG. 5, the TFT may include a substrate 40, a gate electrode 53 provided on the substrate 40, and an insulation layer 54 provided on the gate electrode 53. The substrate 40 may be a transparent substrate which may be, for example, a glass substrate or a transparent plastic substrate. The insulation layer 54 may include silicon oxide or silicon nitride.

A channel layer 55 may be provided on the insulation layer 54. A source electrode 65 may be arranged at one side of the channel layer 55. A drain electrode 70 may be arranged on one side of the channel layer 55 to be separated from the source electrode 65. The channel layer 55 may be formed of a transparent oxide semiconductor. The oxide semiconductor may include any one of zinc oxide, tin oxide, Ga—In—Zn oxide, In—Zn oxide, and In—Sn oxide, and a material obtained by doping the above materials with aluminium (Al), nickel (Ni), copper (Cu), tantalum (Ta), hafnium (Hf) or titanium (Ti). However, example embodiments are not limited thereto. The semiconductor wire grid 75, with the channel layer 55, may be provided on the insulation layer 54. The semiconductor wire grid 75 may be formed of a semiconductor material as described above. The semiconductor wire grid 75 may be formed of the same material as that used for the channel layer 55, or a material different from that used for the channel layer 55.

A passivation layer 77 covering the source electrode 65, the drain electrode 70, and the wire grid 75 may be provided. The passivation layer 77 may include silicon nitride, silicon oxide, or an organic insulation material. However, example embodiments are not limited thereto. The passivation layer 77 may include a via hole 73 to expose a portion of the drain electrode 70. The pixel electrode 80 may be connected to the drain electrode 70 via the via hole 73. The pixel electrode 80 may be extended over an upper portion of the semiconductor wire grid 75.

The gate electrode 53 may be connected to a gate line 50. The source electrode 65 may be connected to a data line 60. A capacitor electrode 85 may be provided on a side of the pixel electrode 80 so as to maintain the voltage applied to the pixel electrode 80 during scanning of the gate line 50.

When a voltage is applied to the gate electrode 53, electric charges may be induced in the lower portion of the channel layer 55. For example, when a voltage equal to or less than a threshold voltage is applied to the gate electrode 53, mobile carriers may not be excited in the channel layer 55. Accordingly, even when a bias voltage is applied to the source-drain electrodes 65 and 70, current does not flow between the source-drain electrodes 65 and 70 nor in the pixel electrode 80 connected to the drain electrode 70. This state is a TFT-off state.

When a voltage equal to or greater than the threshold voltage is applied to the gate electrode 53, the mobile carriers may be excited in the channel layer 55. In this state, when the bias voltage is applied to the source-drain electrodes 65 and 70, the mobile carriers may be moved. When a voltage is applied to the pixel electrode 80, electric charges may be induced in the semiconductor wire grid 75. This state is a TFT-on state. As the voltage applied to the pixel electrode increases, the amount of electric charges increase. Accordingly, the conductivity of the semiconductor wire grid 75 increases so that the polarization rate may be increased. As the polarization rate of the semiconductor wire grid 75 increases, the light passing through the polarization panel 18 or 22 decreases so that gradation may be displayed.

The voltage or conductivity needed for the semiconductor wire grid 75 to function as a complete polarizer and the voltage applied to the pixel electrode 80 corresponding thereto may vary according to the material forming the semiconductor wire grid 75. For example, assuming that the voltage of the pixel electrode 80, at which the semiconductor wire grid 75 functions as a polarizer, is $V_0$, black may be displayed. When the voltage of the pixel electrode 80 is less than $V_0$, medium brightness may be displayed. When a voltage equal to or less than the threshold voltage of the semiconductor wire grid 75 is applied to the pixel electrode 80, white may be displayed.

For example, when the semiconductor wire grid 75 is formed of an n-type semiconductor and a positive (+) voltage is applied to the pixel electrode 80, electrons may be induced in the semiconductor wire grid 75 so that conductivity may be increased. As the positive (+) voltage applied to the pixel electrode 80 increases, the induced electrons increases so that the conductivity of the semiconductor wire grid 75 may increase. As the conductivity increases, the amount of light passing through the polarization panel 18 of FIG. 1 decreases so that gradation may be displayed. When a negative (−) voltage is applied to the pixel electrode 80, the conductivity of the semiconductor wire grid 75 decreases so that the amount of light passing through the polarization panel 18 may increase, thereby displaying white.

When the semiconductor wire grid 75 is formed of a p-type semiconductor and a negative (−) voltage is applied to the pixel electrode 80, holes may be induced in the semiconductor wire grid 75 so that conductivity may be increased. As the absolute value of the voltage applied to the pixel electrode 80 increases, the number of the induced holes increases so that the conductivity of the semiconductor wire grid 75 may increase. As the conductivity increases, the amount of light passing through the polarization panel 18 decreases so that gradation may be displayed. When the positive (+) voltage is applied to the pixel electrode 80, the conductivity of the semiconductor wire grid 75 decreases so that the amount of light passing through the polarization panel 18 may increase, thereby displaying white.

A method of manufacturing a display apparatus according to example embodiments is described below with reference to FIGS. 6A-6E. FIGS. 6A-6E are cross-sectional views for explaining a method of manufacturing a display apparatus according to example embodiments.

Figure 6A:
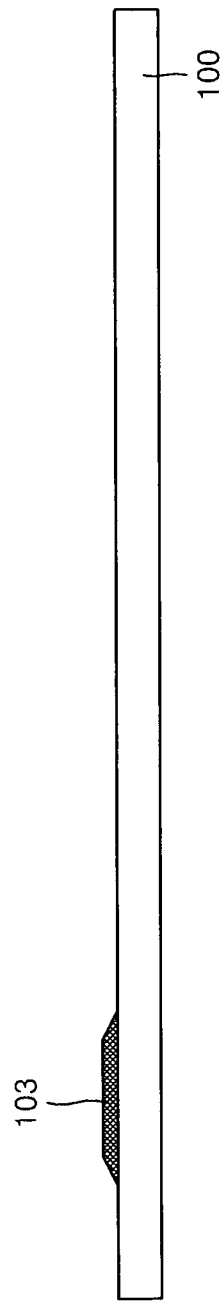
FIGS. 6A-6E are cross-sectional views for explaining a method of manufacturing a display apparatus according to example embodiments.
Figure 6B:
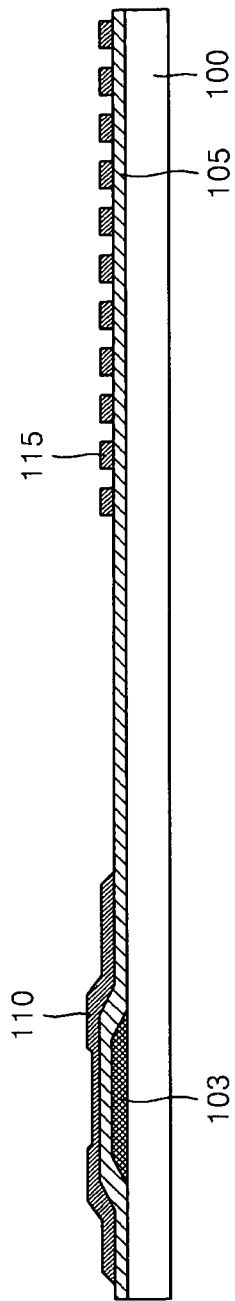

Referring to FIG. 6A, a metal layer may be deposited on a substrate 100 and patterned to form a gate electrode 103. The substrate 100 may be a glass substrate or a transparent plastic substrate. As illustrated in FIG. 6B, an insulation layer 105 may be deposited on the substrate 100 and the gate electrode 103. The insulation layer 105 may be formed of silicon oxide or silicon nitride. A semiconductor layer may be deposited on the insulation layer 105 and patterned to form a channel layer 110 and a semiconductor wire grid 115. The channel layer 110 and the semiconductor wire grid 115 may be formed of different semiconductor materials. In example embodiments, a first semiconductor material may be deposited to form the channel layer 110.

Figure 6C:
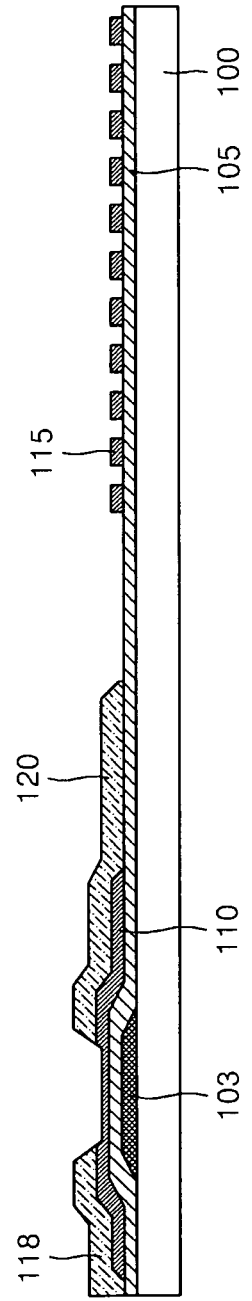
Figure 6D:
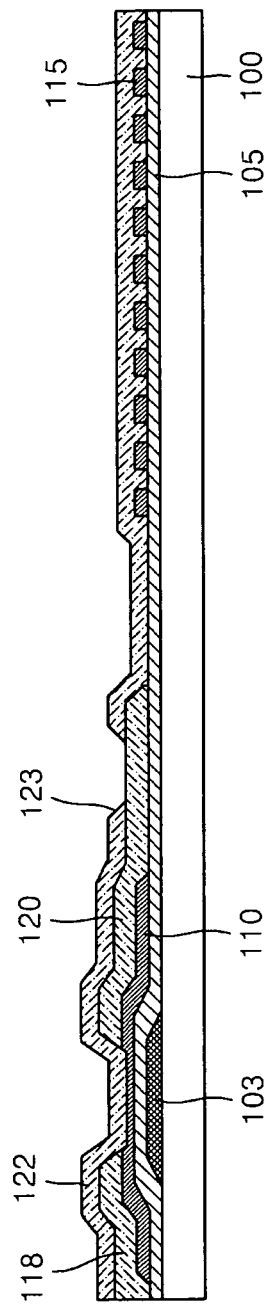
Figure 6E:
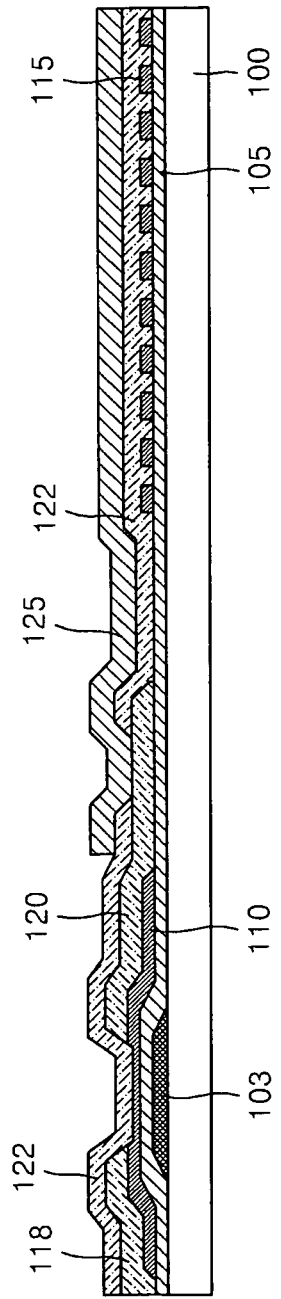

A second semiconductor material may be deposited to form the semiconductor wire grid 115. Reversely, forming the semiconductor wire grid 115 first and the channel layer 110 may be possible. Referring to FIG. 6C, a source electrode 118 may be formed on a side of the channel layer 110 and a drain electrode 120 may be patterned at the other side thereof. As illustrated in FIG. 6D, a passivation layer 122 may be deposited to cover the source electrode 118, the drain electrode 120, and the semiconductor wire grid 115. A via hole 123 may be formed by patterning the passivation layer 122. Referring to FIG. 6E, after a transparent electrode is deposited on an upper layer of FIG. 6D, a pixel electrode 125 may be formed by patterning the transparent electrode. The pixel electrode 125 may contact the drain electrode 120 via the via hole 123 and be arranged above the semiconductor wire grid 115.

As described above, according to the semiconductor wire grid according to example embodiments, the polarization state of light may be controlled by changing the applied voltage to adjust the conductivity of the semiconductor wire grid. The semiconductor wire grid may control the amount of polarization and also perform the polarization operation. Thus, the display apparatus having the semiconductor wire grid may represent gradation without a liquid crystal layer.

According to the method of manufacturing a display apparatus according to example embodiments, because the channel layer and the semiconductor wire grid are formed on the same layer through a semiconductor process, a manufacturing process may be simplified.

It should be understood that example embodiments described therein should be considered in a descriptive sense only and not for purposes of limitation. Descriptions of features or aspects within each example embodiment should typically be considered as available for other similar features or aspects in other example embodiments.

What is claimed is:

1. A semiconductor wire grid, comprising:
a plurality of wires arranged separately on a substrate, the plurality of wires formed of a semiconductor and including a groove therebetween,
wherein the semiconductor wire grid is directly on an insulator layer,
wherein conductivity of the semiconductor wire grid varies according to an applied voltage such that a polarization rate of the semiconductor wire grid is controlled, and gradation is displayed according to the polarization rate of the semiconductor wire grid, and
wherein a pixel electrode is above the semiconductor wire grid, and the pixel electrode applies the voltage to the semiconductor wire grid.

2. The semiconductor wire grid of claim 1, wherein the plurality of wires include at least one selected from a group consisting of carbon (C), silicon (Si), silicon germanium (SiGe), gallium nitride (GaN), gallium arsenide (GaAs), indium antimonide (InSb), indium phosphide (InP), and cadmium sulphide (CdS).

3. The semiconductor wire grid of claim 1, wherein the semiconductor of the plurality of wires includes at least one of an oxide semiconductor and an organic semiconductor.

4. The semiconductor wire grid of claim 1, wherein the plurality of wires includes at least one of carbon nanotube and graphene.

5. A display apparatus, comprising:
an insulation layer on a substrate;
a channel layer and a semiconductor wire grid on the insulation layer, the semiconductor wire grid formed of a semiconductor;
a polarization panel under or above the semiconductor wire grid; and
a pixel electrode above the semiconductor wire grid,
wherein the semiconductor wire grid is separately arranged with the channel layer on the insulation layer,
wherein conductivity of the semiconductor wire grid varies according to an applied voltage such that a polarization rate of the semiconductor wire grid is controlled and gradation is displayed according to the polarization rate of the semiconductor wire grid, and
wherein the pixel electrode applies the voltage to the semiconductor wire grid.

6. The display apparatus of claim 5, wherein the semiconductor wire grid includes at least one selected from a group consisting of carbon (C), silicon (Si), silicon germanium (SiGe), gallium nitride (GaN), gallium arsenide (GaAs), indium antimonide (InSb), indium phosphide (InP), and cadmium sulphide (CdS).

7. The display apparatus of claim 5, wherein the semiconductor wire grid includes at least one of an oxide semiconductor and an organic semiconductor.

8. The display apparatus of claim 5, wherein the semiconductor wire grid includes at least one of carbon nanotube and graphene.

9. The display apparatus of claim 5, further comprising:
a thin film transistor (TFT) for switching the pixel electrode.

10. The display apparatus of claim 5, wherein the semiconductor wire grid is formed of the same material as that of the channel layer.

11. The display apparatus of claim 5, wherein the semiconductor wire grid is formed of an n-type semiconductor.

12. The display apparatus of claim 11, wherein:
when a positive voltage is applied to the pixel electrode, the semiconductor wire grid performs a polarization operation, and as the amount of the positive voltage increases, the polarization rate increases, and
when a negative voltage is applied to the pixel electrode, the semiconductor wire grid does not perform the polarization operation.

13. The display apparatus of claim 5, wherein the semiconductor wire grid is formed of a p-type semiconductor.

14. The display apparatus of claim 13, wherein:
when a negative voltage is applied to the pixel electrode, the semiconductor wire grid performs a polarization operation, and as the absolute value of the negative voltage increases, a polarization rate increases, and
when a positive voltage is applied to the pixel electrode, the semiconductor wire grid does not perform the polarization operation.

15. The display apparatus of claim 5, wherein the semiconductor wire grid further comprises:
a plurality of wires arranged separately on a substrate, the plurality of wires formed of a semiconductor and including a groove therebetween.

16. The display apparatus of claim 5, wherein the semiconductor wire grid is co-planar with the channel layer.

* * * * *